US 11,183,388 B2

(12) United States Patent
Tamura et al.

(10) Patent No.: US 11,183,388 B2
(45) Date of Patent: Nov. 23, 2021

(54) SEMICONDUCTOR DEVICE

(71) Applicant: FUJI ELECTRIC CO., LTD., Kanagawa (JP)

(72) Inventors: Takahiro Tamura, Matsumoto (JP); Yuichi Onozawa, Matsumoto (JP); Misaki Takahashi, Matsumoto (JP)

(73) Assignee: FUJI ELECTRIC CO., LTD., Kanagawa (JP)

( * ) Notice: Subject to any disclaimer, the term of this patent is extended or adjusted under 35 U.S.C. 154(b) by 0 days.

(21) Appl. No.: 16/933,993

(22) Filed: Jul. 20, 2020

(65) Prior Publication Data

US 2020/0350170 A1 Nov. 5, 2020

Related U.S. Application Data

(60) Division of application No. 15/879,417, filed on Jan. 24, 2018, now Pat. No. 10,734,230, which is a (Continued)

(30) Foreign Application Priority Data

Feb. 23, 2016 (JP) .............................. JP2016-032401

(51) Int. Cl.
*H01L 21/22* (2006.01)
*H01L 27/06* (2006.01)
(Continued)

(52) U.S. Cl.
CPC .......... *H01L 21/221* (2013.01); *H01L 21/265* (2013.01); *H01L 21/322* (2013.01);
(Continued)

(58) Field of Classification Search
CPC . H01L 21/265; H01L 21/322; H01L 27/0664; H01L 27/0727; H01L 29/0638;
(Continued)

(56) References Cited

U.S. PATENT DOCUMENTS 5,717,244 A 2/1998 Soejima
7,842,590 B2 11/2010 Gutt et al.
(Continued)

FOREIGN PATENT DOCUMENTS

CN 104969360 A 10/2015
JP 2011086883 A 4/2011
(Continued)

OTHER PUBLICATIONS

Notice of First Office Action for Patent Application No. 201780002628. 7, issued by The China National Intellectual Property Administration dated Jul. 3, 2020.
(Continued)

*Primary Examiner* — Didarul A Mazumder

(57) ABSTRACT

A semiconductor device is provided. The semiconductor device includes: a first region formed on a front surface side of a semiconductor substrate; a drift region formed closer to a rear surface of the semiconductor substrate than the first region is; a buffer region that: is formed closer to the rear surface of the semiconductor substrate than the drift region is; and has one or more peaks of an impurity concentration that are higher than an impurity concentration of the drift region; and a lifetime killer that: is arranged on a rear surface side of the semiconductor substrate; and shortens a carrier lifetime, wherein a peak of a concentration of the lifetime killer is arranged between: a peak that is closest to a front surface of the semiconductor substrate among the peaks of the impurity concentration in the buffer region; and the rear surface of the semiconductor substrate.

8 Claims, 13 Drawing Sheets

Related U.S. Application Data continuation of application No. PCT/JP2017/006830, filed on Feb. 23, 2017.

(51) Int. Cl.
| | |
|---|---|
| *H01L 29/32* | (2006.01) |
| *H01L 29/868* | (2006.01) |
| *H01L 21/322* | (2006.01) |
| *H01L 29/861* | (2006.01) |
| *H01L 21/265* | (2006.01) |
| *H01L 27/07* | (2006.01) |
| *H01L 29/36* | (2006.01) |
| *H01L 29/06* | (2006.01) |
| *H01L 29/423* | (2006.01) |
| *H01L 29/78* | (2006.01) |
| *H01L 29/08* | (2006.01) |
| *H01L 29/10* | (2006.01) |
| *H01L 29/739* | (2006.01) |

(52) U.S. Cl.
CPC ...... *H01L 27/0664* (2013.01); *H01L 27/0727* (2013.01); *H01L 29/0638* (2013.01); *H01L 29/0696* (2013.01); *H01L 29/0834* (2013.01); *H01L 29/1095* (2013.01); *H01L 29/32* (2013.01); *H01L 29/36* (2013.01); *H01L 29/4236* (2013.01); *H01L 29/4238* (2013.01); *H01L 29/7397* (2013.01); *H01L 29/7802* (2013.01); *H01L 29/861* (2013.01); *H01L 29/868* (2013.01); *H01L 29/8613* (2013.01)

(58) Field of Classification Search
CPC ............. H01L 29/0696; H01L 29/0834; H01L 29/1095; H01L 29/32; H01L 29/36; H01L 29/4236; H01L 29/4238; H01L 29/7397; H01L 29/7802; H01L 29/861; H01L 29/8613; H01L 29/868; H01L 21/336; H01L 21/329; H01L 29/12; H01L 29/739; H01L 29/78
USPC ........................................................ 257/140
See application file for complete search history.

(56) References Cited

U.S. PATENT DOCUMENTS

| | | |
|---|---|---|
| 10,374,102 B2 | 8/2019 | Onozawa |
| 2005/0161746 A1 | 7/2005 | Mauder |
| 2006/0043470 A1 | 3/2006 | Schulze et al. |
| 2006/0278925 A1 | 12/2006 | Yamaguchi |
| 2009/0224284 A1 | 9/2009 | Nemoto |
| 2012/0043582 A1* | 2/2012 | Koyama ............... H01L 21/263 257/140 |
| 2012/0267681 A1 | 10/2012 | Nemoto |
| 2012/0313139 A1 | 12/2012 | Matsuura |
| 2013/0075783 A1 | 3/2013 | Yamazaki |
| 2014/0217407 A1 | 8/2014 | Mizushima |
| 2014/0217463 A1 | 8/2014 | Schulze |
| 2014/0246755 A1 | 9/2014 | Yoshimura |
| 2014/0291723 A1 | 10/2014 | Miyazaki |
| 2014/0357026 A1 | 12/2014 | Kobayashi |
| 2014/0374793 A1 | 12/2014 | Miyazaki |
| 2015/0228717 A1* | 8/2015 | Hara ................... H01L 29/0626 257/140 |
| 2015/0311279 A1 | 10/2015 | Onozawa |
| 2015/0318385 A1* | 11/2015 | Kameyama ......... H01L 29/7397 257/140 |
| 2015/0364613 A1 | 12/2015 | Onozawa et al. |
| 2016/0254374 A1* | 9/2016 | Kameyama ......... H01L 29/7397 257/140 |
| 2016/0276446 A1 | 9/2016 | Wakimoto |
| 2017/0069625 A1* | 3/2017 | Hirabayashi ...... H01L 21/26513 |
| 2018/0212762 A1 | 1/2018 | Mukai |

FOREIGN PATENT DOCUMENTS

| | | |
|---|---|---|
| JP | 2015-211149 A | 11/2015 |
| WO | 2014/156849 A1 | 10/2014 |

OTHER PUBLICATIONS

International Search Report for International Patent Application No. PCT/JP2017/006830, issued by the Japan Patent Office dated May 23, 2017.
U.S. Appl. No. 15/879,417, filed Jan. 24, 2018, to Takahiro Tamura.

* cited by examiner

SEMICONDUCTOR DEVICE

CROSS-REFERENCE TO RELATED APPLICATIONS

This application is a divisional of U.S. patent application Ser. No. 15/879,417, filed on Jan. 24, 2018, which is a continuation of International Application No. PCT/JP2017/006830 filed on Feb. 23, 2017, which claims priority to Japanese Patent Application No. 2016-032401, filed on Feb. 23, 2016, the contents of each of which are hereby incorporated herein by reference in their entirety.

BACKGROUND

1. Technical Field

The present invention relates to a semiconductor device.

2. Related Art

Conventionally, a structure of a power semiconductor element provided with a field stop layer has been known (please see Patent Document 1, for example). n-type impurities such as protons are implanted to the field stop layer.
Patent Document 1: Specification of U.S. Pat. No. 7,842,590

If n-type impurities such as protons are implanted to a semiconductor substrate, and the semiconductor substrate is subjected to thermal treatment, the impurities such as protons terminate defects and the like in the semiconductor substrate, and the carrier lifetime recovers. But if the carrier lifetime on the rear surface side of the semiconductor substrate becomes too long, tail current at the time of reverse recovery operation increases, and the reverse recovery loss increases.

[General Disclosure]

One aspect of the present invention provides a semiconductor device including a semiconductor substrate. A first conductivity type first region may be formed on a front surface side of the semiconductor substrate. On the semiconductor substrate, a second conductivity type drift region may be formed closer to a rear surface of the semiconductor substrate than the first region is. On the semiconductor substrate, a second conductivity type buffer region that: is formed closer to the rear surface of the semiconductor substrate than the drift region is may be formed. The buffer region may include one or more peaks of an impurity concentration that are higher than an impurity concentration of the drift region. On the semiconductor substrate, a lifetime killer that: is arranged on a rear surface side of the semiconductor substrate; and shortens a carrier lifetime may be formed. A peak of a concentration of the lifetime killer may be arranged between: a peak that is closest to a front surface of the semiconductor substrate among the peaks of the impurity concentration in the buffer region; and the rear surface of the semiconductor substrate.

On the semiconductor substrate, a first conductivity type second region formed between: a peak that is closest to the rear surface of the semiconductor substrate among the peaks of the impurity concentration in the buffer region; and the rear surface of the semiconductor substrate may be further formed. The peak of the concentration of the lifetime killer may be arranged closer to the front surface of the semiconductor substrate than the peak of the impurity concentration in the second region is.

The impurity concentration distribution in the buffer region may have a plurality of peaks. The peak of the concentration of the lifetime killer may be arranged closer to the rear surface of the semiconductor substrate than a peak that is closest to the rear surface of the semiconductor substrate among the peaks of the impurity concentration in the buffer region is.

A distance between the peak of the concentration of the lifetime killer and the peak of the impurity concentration in the second region may be greater than a distance between the peak of the concentration of the lifetime killer and the peak that is closest to the rear surface of the semiconductor substrate among the peaks of the impurity concentration in the buffer region.

The peak of the concentration of the lifetime killer may be arranged between any two peaks of the impurity concentration in the buffer region.

A peak of a concentration of the lifetime killer may be arranged at a position that does not overlap any of the peaks of the impurity concentration in the buffer region.

The peak of the concentration of the lifetime killer may be higher than a peak that is closest to the rear surface of the semiconductor substrate among the peaks of the impurity concentration in the buffer region. The peak of the concentration of the lifetime killer may be lower than the peak of the concentration in the second region.

Protons may be implanted to the buffer region. The lifetime killer may be helium.

A full width at half maximum of a concentration distribution of the lifetime killer in a depth direction of the semiconductor substrate may be equal to or greater than 5 µm. The buffer region may have two peaks of the impurity concentration that sandwich the peak of the concentration of the lifetime killer, and a full width at half maximum of a concentration distribution of the lifetime killer may be equal to or greater than 70% of an interval between the two peaks.

The semiconductor substrate may have a transistor portion in which a transistor is formed and a diode portion in which a diode is formed. The second regions may be discretely provided in the diode portion. On a plane parallel with the rear surface of the semiconductor substrate, a distance D between a boundary between the transistor portion and the diode portion and the second region may be greater than an interval between the second regions.

The distance D may be greater than a thickness of the semiconductor substrate. The distance D may be greater than a width of the second region.

The summary clause does not necessarily describe all necessary features of the embodiments of the present invention. The present invention may also be a sub-combination of the features described above.

DESCRIPTION OF EXEMPLARY EMBODIMENTS

Hereinafter, (some) embodiment(s) of the present invention will be described. The embodiment(s) do(es) not limit the invention according to the claims, and all the combinations of the features described in the embodiment(s) are not necessarily essential to means provided by aspects of the invention.

Figure 1:
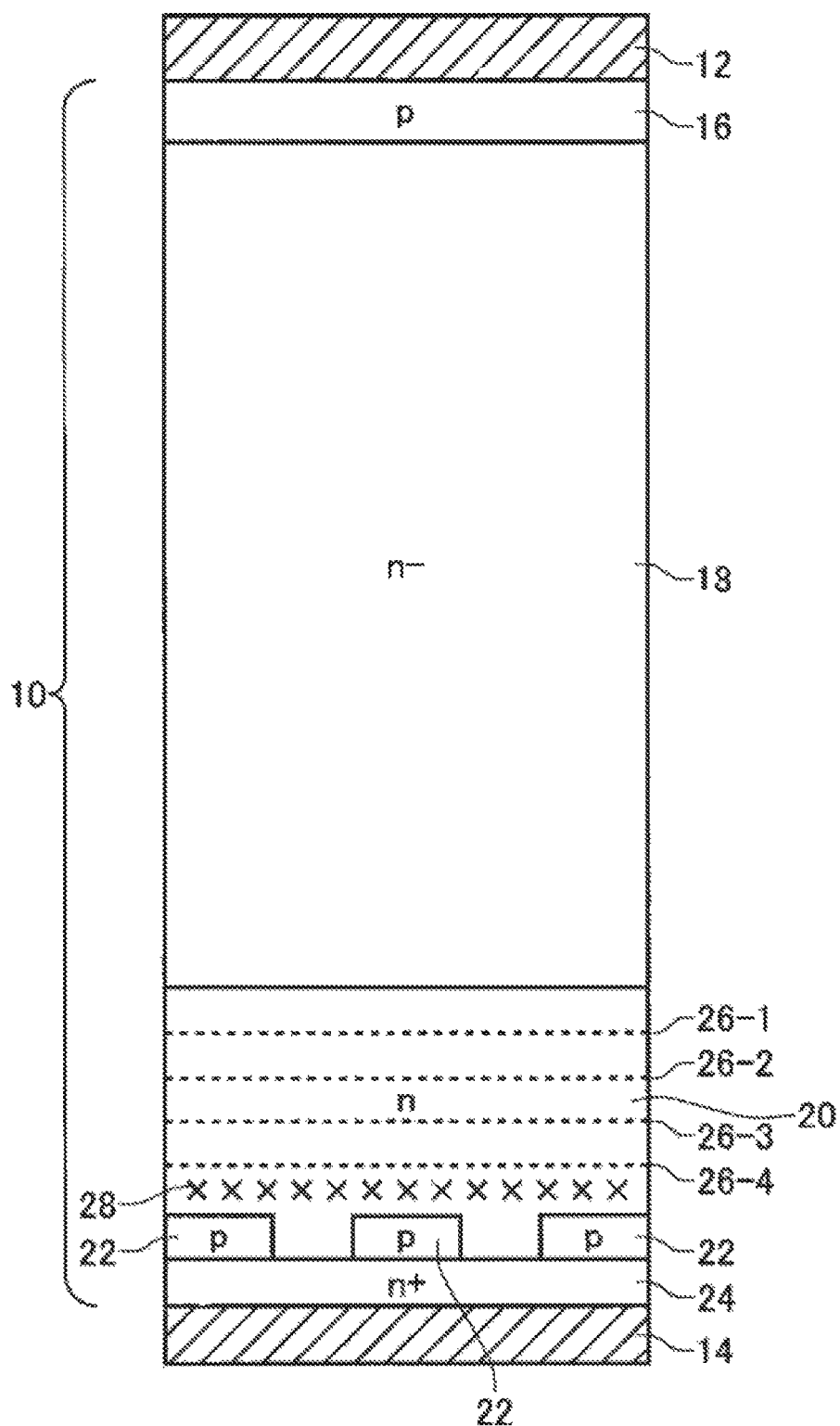
FIG. 1 is a figure showing a cross-section of a semiconductor device 100 according to one embodiment.

FIG. 1 is a figure showing a cross-section of a semiconductor device 100 according to one embodiment. The semiconductor device 100 is a vertical semiconductor device in which electrodes are formed on the front surface and rear surface of a semiconductor substrate 10, and current flows in the depth direction of the semiconductor substrate 10. If in the present specification, simply a front surface and rear surface are mentioned, they refer to the front surface and rear surface of the semiconductor substrate 10. In FIG. 1, a diode is shown as one example of the semiconductor device 100. The diode may function as a free wheeling diode (FWD) provided parallel with a switching element such as an IGBT.

The semiconductor device 100 includes the semiconductor substrate 10, an anode electrode 12 and a cathode electrode 14. The anode electrode 12 is provided contacting the front surface of the semiconductor substrate 10. The cathode electrode 14 is provided contacting the rear surface of the semiconductor substrate 10. The anode electrode 12 and the cathode electrode 14 are formed of metal materials containing aluminum, for example.

The semiconductor substrate 10 is formed of a semiconductor material such as silicon or a compound semiconductor. The semiconductor substrate 10 is doped with a predetermined concentration of impurities. Unless otherwise indicated particularly, the impurities in the present specification refer to a dopant that exhibits an n-type or p-type conduction-typeness when doped to a semiconductor material. The semiconductor substrate 10 in the present example is of an n--type conductivity type. The n-type is one example of a second conductivity type. Also, the p-type is one example of a first conductivity type. However, the first conductivity type and the second conductivity type may be respectively opposite conductivity types.

The semiconductor substrate 10 has an anode region 16, a drift region 18, a buffer region (FS region 20), an intermediate region 22 and a cathode region 24. The anode region 16 is one example of a first region, and the intermediate region 22 is one example of a second region. The buffer region may function as a field stop layer that suppresses spread of a depletion layer.

The drift region 18 is of the same conductivity type as that of the semiconductor substrate 10. In the present example, a region that is in the semiconductor substrate 10 and where the anode region 16, the FS region 20, the intermediate region 22 and the cathode region 24 are not formed functions as the drift region 18.

The anode region 16 is formed on the front surface side of the drift region 18, and electrically connects to the anode electrode 12. The anode region 16 is doped with impurities of a different conductivity type from that of the drift region 18. In the present example, the anode region 16 is of p-type.

The FS region 20 is formed on the rear surface side of the drift region 18. The FS region 20 is of the same conductivity type as that of the drift region 18, and additionally a higher concentration of impurities than that for the drift region 18 is implanted thereto. In the present example, the FS region 20 is of n-type. Also, impurities implanted to the FS region 20 are referred to as first impurities. The first impurities are hydrogen or phosphorus, for example.

Hydrogen is bonded to vacancies (V) and oxygen (O) in a clustered manner in a semiconductor material to constitute defect complex (VOH defects). Because these VOH defects become a donor, the VOH defects become an n-type dopant (impurities). Hydrogen may be introduced into the semiconductor material by implantation of hydrogen ions such as protons or deuterons. Oxygen may be included in a semiconductor material at the time of manufacture of it or may be introduced intentionally into a semiconductor region during the manufacture of the semiconductor device. The semiconductor material may be manufactured by a float zone technology (FZ technology), a Czochralski process (CZ process), a magnetic field-applied Czochralski process (MCZ process) or the like. For example, if a CZ process or MCZ process is applied, a dopant consisting of VOH defects can be formed suitably because the concentration of oxygen in a semiconductor material becomes equal to or higher than $1 \times 10^{17}/cm^3$ and equal to or lower than $1 \times 10^{18}/cm^3$.

Vacancies may be included in a semiconductor material at the time of manufacture of it or may be introduced intentionally into a semiconductor region during the manufacture of the semiconductor device. By providing the FS region 20 having a high concentration, it is possible to prevent a depletion layer extending from an interface of the anode region 16 from reaching the intermediate region 22 or cathode region 24. The vacancies may be introduced for example by ion-implantation using protons, an electron beam, helium or the like.

The concentration distribution of the first impurities in the depth direction of the semiconductor substrate 10 has one or more peaks 26 in the FS region 20. The semiconductor device 100 illustrated in FIG. 1 has a first peak 26-1, a second peak 26-2, a third peak 26-3 and a fourth peak 26-4. The impurity concentrations at the respective peaks 26 are higher than the impurity concentration in the drift region 18.

The intermediate region 22 is formed on the rear surface side of the FS region 20. The intermediate region 22 in the present example is formed locally on a plane parallel with the rear surface of the semiconductor substrate 10. The intermediate region 22 is of the same conductivity type as that of the anode region 16. In the present example, the intermediate region 22 is of p-type. Also, impurities implanted to the intermediate region 22 are referred to as second impurities. The second impurities are boron, for example. A region that is on the rear surface side of the FS region 20 and where the intermediate region 22 is not formed is of the same conductivity type as that of the drift region 18. The impurity concentration of the region may be approximately the same as the impurity concentration at an end portion of the rear surface side of the FS region 20.

The cathode region 24 is formed on the rear surface side of the intermediate region 22. The cathode region 24 is of the same conductivity type as that of the FS region 20. The impurity concentration in the cathode region 24 in the present example is higher than the respective impurity concentrations of the FS region 20 and the intermediate region 22. The cathode region 24 in the present example is of n+-type. Also, impurities implanted to the cathode region 24 are referred to as third impurities. The third impurities are phosphorus, for example. The cathode region 24 is electrically connected to the cathode electrode 14.

A phenomenon is known in which if a diode is switched during reverse recovery at a current that is as low as about 1/10 of the rated current, carriers on the cathode side are depleted, and a current or voltage waveform vibrates severely. In the semiconductor device 100 of the present example, if a depletion layer spreads from the anode side at the time of reverse recovery, and carriers on the cathode side are about to be depleted, a high electric field is applied at the pn junction between the intermediate region 22 and the cathode region 24, and the junction experiences avalanche breakdown. Thereby, holes are implanted from the cathode side to the drift region 18, and the carrier density of the drift region 18 on the cathode side can be increased. As a result, oscillation of voltage/current due to depletion of carriers can be suppressed.

Also, if impurities such as protons are implanted to the FS region 20, and then the semiconductor substrate 10 is subjected to thermal treatment, the impurities such as protons are diffused to terminate defects. Thereby, the lifetime of a region where the impurities such as protons are diffused recovers. Thereby, reverse recovery operation of the semiconductor device 100 can be made soft recovery operation.

On the other hand, if the carrier lifetime on the cathode side becomes too long, tail current at the time of reverse recovery operation increases. If the tail current increases, reverse recovery loss increases. To cope with this, the semiconductor device 100 of the present example has a lifetime killer 28 that is arranged on the rear surface side of the semiconductor substrate 10 and shortens the carrier lifetime. The lifetime killer 28 is helium, for example.

The peak of the concentration distribution in the depth direction of the lifetime killer 28 is arranged between the first peak 26-1 that is closest to the front surface among the peaks 26 in the FS region 20 and the rear surface of the semiconductor substrate 10 (in the present example, a plane contacting the cathode electrode 14). With such a configuration, it is possible to shorten the carrier lifetime of a region that contributes to tail current to reduce tail current.

Figure 2:
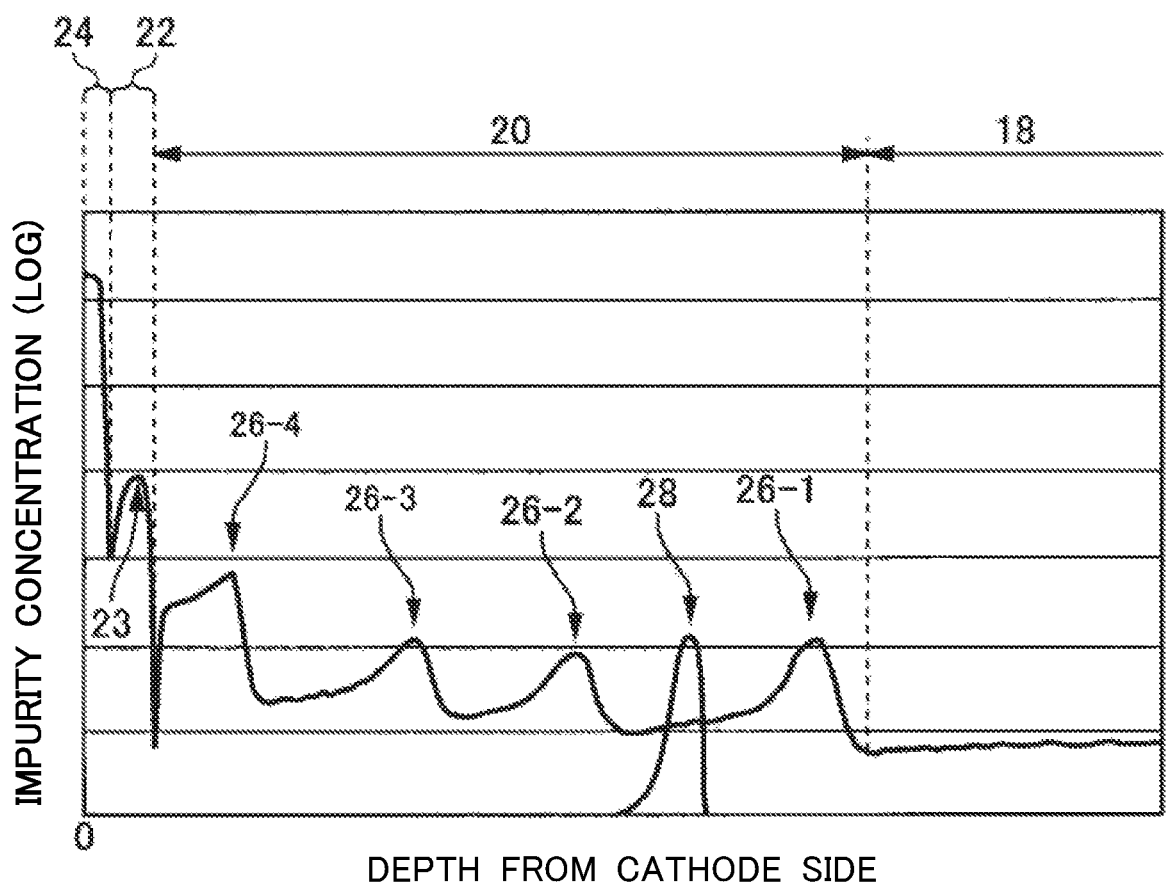
FIG. 2 is a figure showing one example of the impurity concentration distribution in a cathode region 24, an intermediate region 22, an FS region 20 and a drift region 18.

FIG. 2 is a figure showing one example of the impurity concentration distribution in the cathode region 24, the intermediate region 22, the FS region 20 and the drift region 18. Also, the concentration distribution of the lifetime killer 28 is shown in FIG. 2 as well. The impurity concentration distribution in the cathode region 24, the intermediate region 22, the FS region 20 and the drift region 18 shows the net impurity concentration (net doping concentration) obtained by integrating the concentrations of respective impurities other than the lifetime killer 28. As mentioned above, the peak of the impurity concentration of the lifetime killer 28 is arranged between the first peak 26-1 that is closest to the front surface (that is, closest to the drift region 18) among the peaks 26 of the impurity concentration in the FS region 20 and the rear surface of the semiconductor substrate 10. The peak concentration of the first peak 26-1 closest to the front surface may be higher than the peak concentration of the second peak 26-2 adjoining it on the rear surface side.

If the semiconductor substrate 10 has the intermediate region 22, the peak of the impurity concentration of the lifetime killer 28 is arranged closer to the front surface of the semiconductor substrate 10 than a peak 23 of the impurity concentration in the intermediate region 22 is. Thereby, it is possible to suppress carrier disappearance in the intermediate region 22 due to the lifetime killer 28 being implanted.

Also, if a plurality of the peaks 26 are present in the FS region 20, the peak of the impurity concentration of the lifetime killer 28 may be arranged between any two peaks 26 among the plurality of peaks 26. The peak of the impurity concentration of the lifetime killer 28 may be arranged between the first peak 26-1 closest to the front surface and the second peak 26-2 adjoining it, may be arranged between the fourth peak 26-4 closest to the rear surface and the third peak 26-3 adjoining it, or may be arranged between two peaks 26 arranged not closest to the front surface or rear surface.

Also, the peak of the impurity concentration of the lifetime killer 28 may be arranged closer to the rear surface than the fourth peak 26-4 that is closest to the rear surface among the peaks 26 of the impurity concentration in the FS region 20 is. By arranging the peak of the impurity concentration of the lifetime killer 28 closer to the rear surface than the fourth peak 26-4 is, the peak of the lifetime killer 28 can be arranged in a region which the depletion layer spreading from the anode side does not reach. Accordingly, increase in leak current due to the lifetime killer 28 being implanted can be suppressed.

Figure 3:
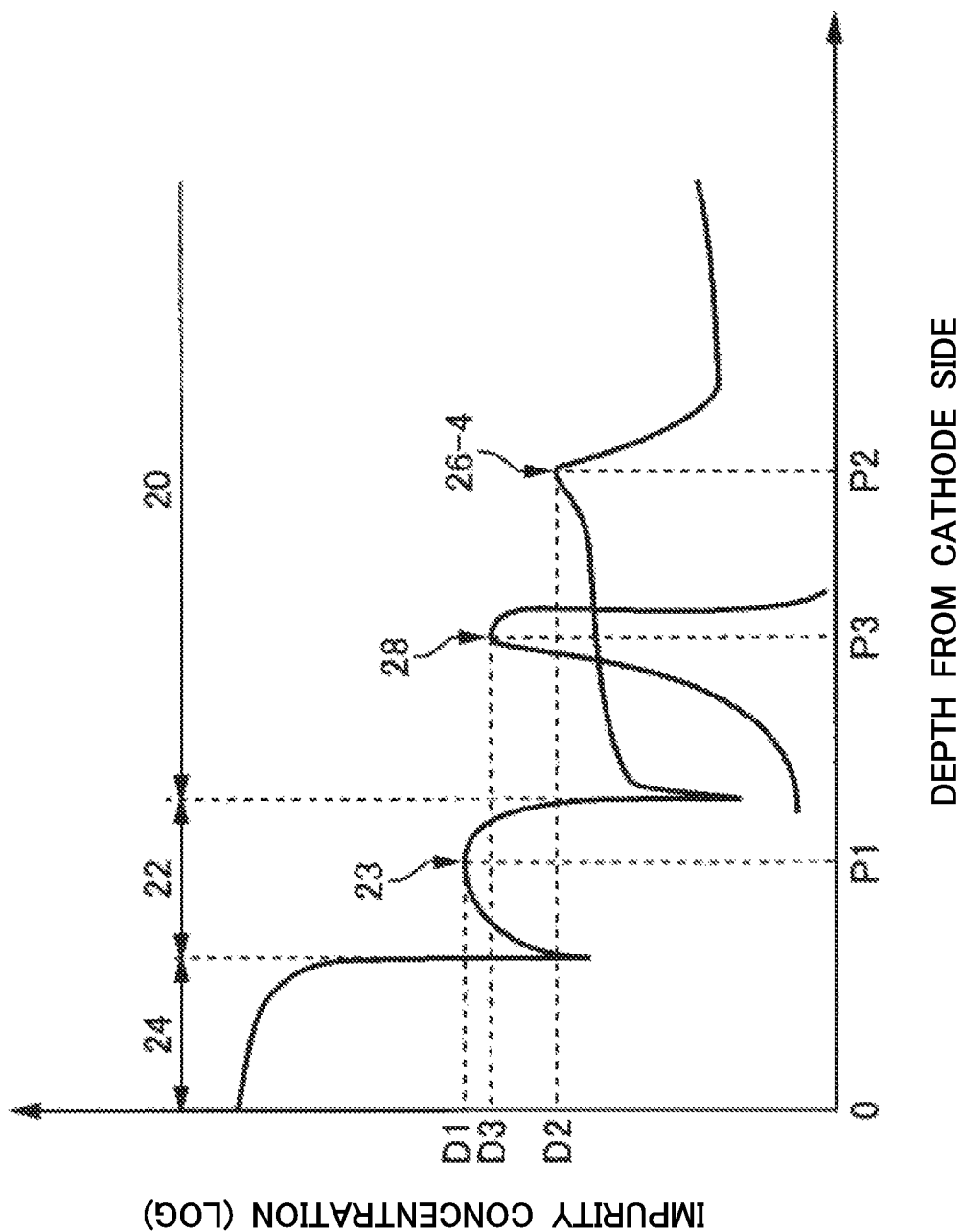
FIG. 3 is an enlarged figure showing the impurity concentration distribution at the portion near the intermediate region 22 and a fourth peak 26-4.

FIG. 3 is an enlarged figure showing the impurity concentration distribution at the portion near the intermediate region 22 and the fourth peak 26-4. In the present example, the peak of the concentration of the lifetime killer 28 is arranged between the peak 23 of the impurity concentration in the intermediate region 22 and the fourth peak 26-4. It is assumed in the present example that the depth position of the peak of the impurity concentration in the intermediate region 22 is P1, the depth position of the fourth peak 26-4 is P2 and the depth position of the concentration peak of the lifetime killer 28 is P3. The positions of the respective peaks are positions where the concentration shows its maximum values.

The distance (P3-P1) between the peak of the concentration of the lifetime killer 28 and the peak 23 of the impurity concentration in the intermediate region 22 is preferably greater than the distance (P2-P3) between the peak of the concentration of the lifetime killer 28 and the fourth peak 26-4 that is in the FS region 20 and is closest to the rear surface. That is, the concentration peak of the lifetime killer 28 is arranged between the peak 23 and the fourth peak 26-4 and preferably closer to the fourth peak 26-4.

Thereby, it is possible to suppress carrier disappearance in the intermediate region 22 due to the lifetime killer 28 being implanted. The distance (P3-P1) may be twice the distance (P2-P3) or greater, or three times the distance (P2-P3) or greater.

Also, a peak value D3 of the concentration of the lifetime killer 28 may be lower than a peak value D1 of the concentration in the intermediate region 22. Thereby, the vibration suppression function of the intermediate region 22 can be attained even if carriers in the intermediate region 22 partially disappear due to the lifetime killer 28 being implanted. The peak value D3 of the concentration of the lifetime killer 28 may be 80% of the peak value D1 or lower, or 50% of the peak value D1 or lower.

Also, the peak value D3 of the concentration of the lifetime killer 28 may be higher than the peak value D2 of the fourth peak 26-4 that is closest to the rear surface among the peaks 26 of the impurity concentration in the FS region 20. Thereby, even if the carrier lifetime recovers due to protons or the like, excess carriers on the rear surface side at the time of reverse recovery operation can be reduced sufficiently. The peak value D3 of the concentration of the lifetime killer 28 may be twice the peak value D2 or greater, five times the peak value D2 or greater, or ten times the peak value D2 or greater.

Figure 4:
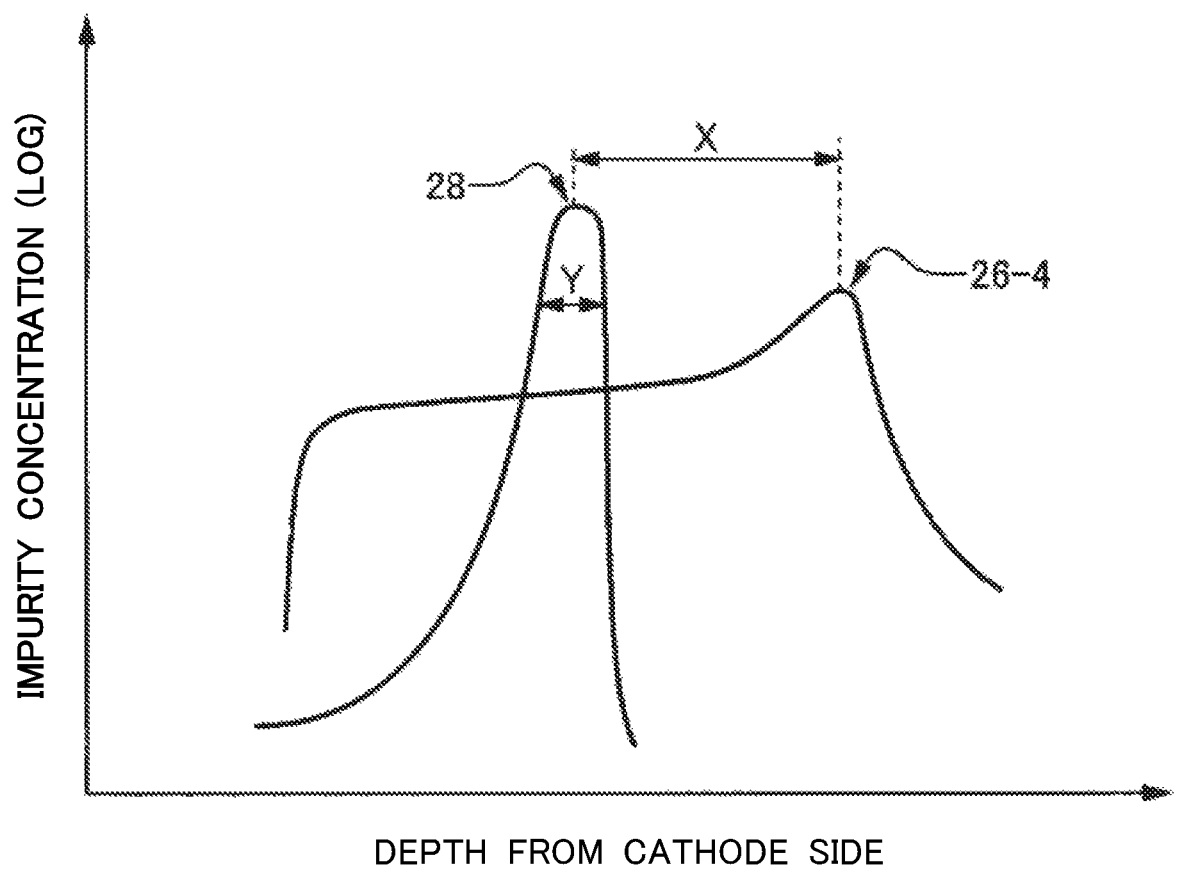
FIG. 4 is a figure showing a positional relationship between the peak of the concentration of a lifetime killer 28 and a peak 26 in the FS region 20.

FIG. 4 is a figure showing a positional relationship between the peak of the concentration of the lifetime killer 28 and a peak 26 in the FS region 20. The peak of the concentration of the lifetime killer 28 is arranged preferably at a position where it does not overlap any of the peaks 26 of the impurity concentration in the FS region 20. Thereby, it is possible to suppress defects generated by the lifetime killer 28 excessively recovering due to protons or the like implanted to the FS region 20.

The phrase that "peaks of concentrations do not overlap" refers to that a distance X between the peaks is equal to or greater than a predetermined value. As one example, the distance X may be equal to or greater than a half width at half maximum Y/2 of the concentration distribution of the lifetime killer 28, equal to or greater than a full width at half maximum Y of it, or twice the full width at half maximum Y or greater.

Likewise, the peak of the concentration of the lifetime killer 28 preferably does not overlap the peak 23 of the impurity concentration of the intermediate region 22. Thereby, it is possible to suppress carriers in the intermediate region 22 disappearing due to the lifetime killer 28.

Also, the lifetime killer 28 may be implanted at a plurality of positions in the depth direction. As one example, concentration peaks of the lifetime killer 28 may be formed respectively between the peak 23 of the intermediate region 22 and the fourth peak 26-4 in the FS region 20 and between any two peaks 26 in the FS region 20. The values of the plurality of concentration peaks of the lifetime killer 28 may decrease as the distance from the cathode side increases.

Figure 5:
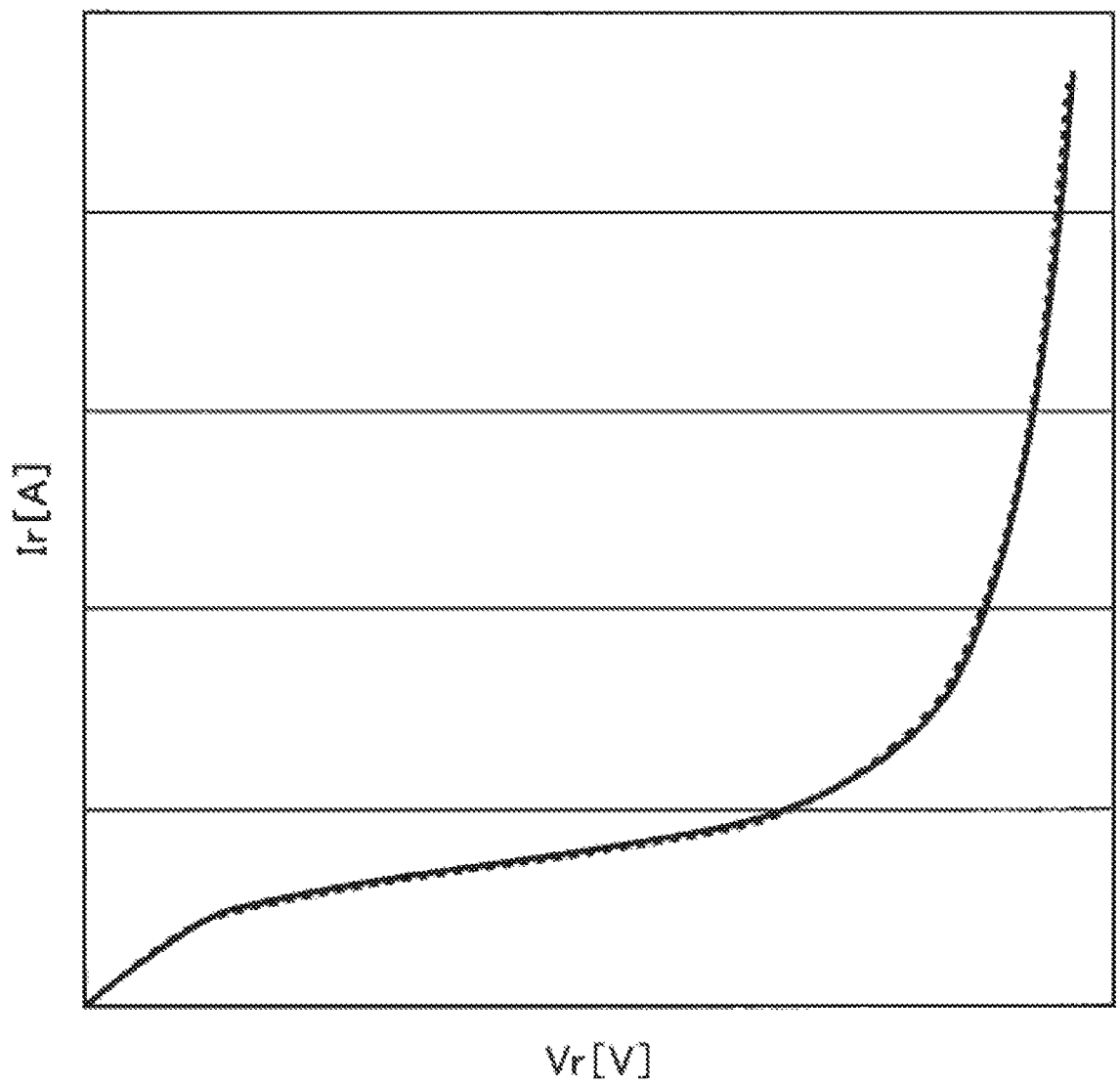
FIG. 5 is a figure showing a result of measurement of leak current of the semiconductor device 100.

FIG. 5 is a figure showing a result of measurement of leak current of the semiconductor device 100. In the semiconductor device 100 of the present example, as shown in FIG. 3, the lifetime killer 28 is implanted between the peak 23 of the intermediate region 22 and the fourth peak 26-4 that is in the FS region 20 and is closest to the cathode. In FIG. 5, the horizontal axis indicates reverse bias voltage Vr, and the vertical axis indicates leak current Ir.

Also, in FIG. 5, an example in which the lifetime killer 28 is implanted is indicated with a solid line, and an example in which the lifetime killer 28 is not implanted is indicated with a dotted line. As shown in FIG. 5, leak current does not increase even if the lifetime killer 28 is implanted.

Figure 6:
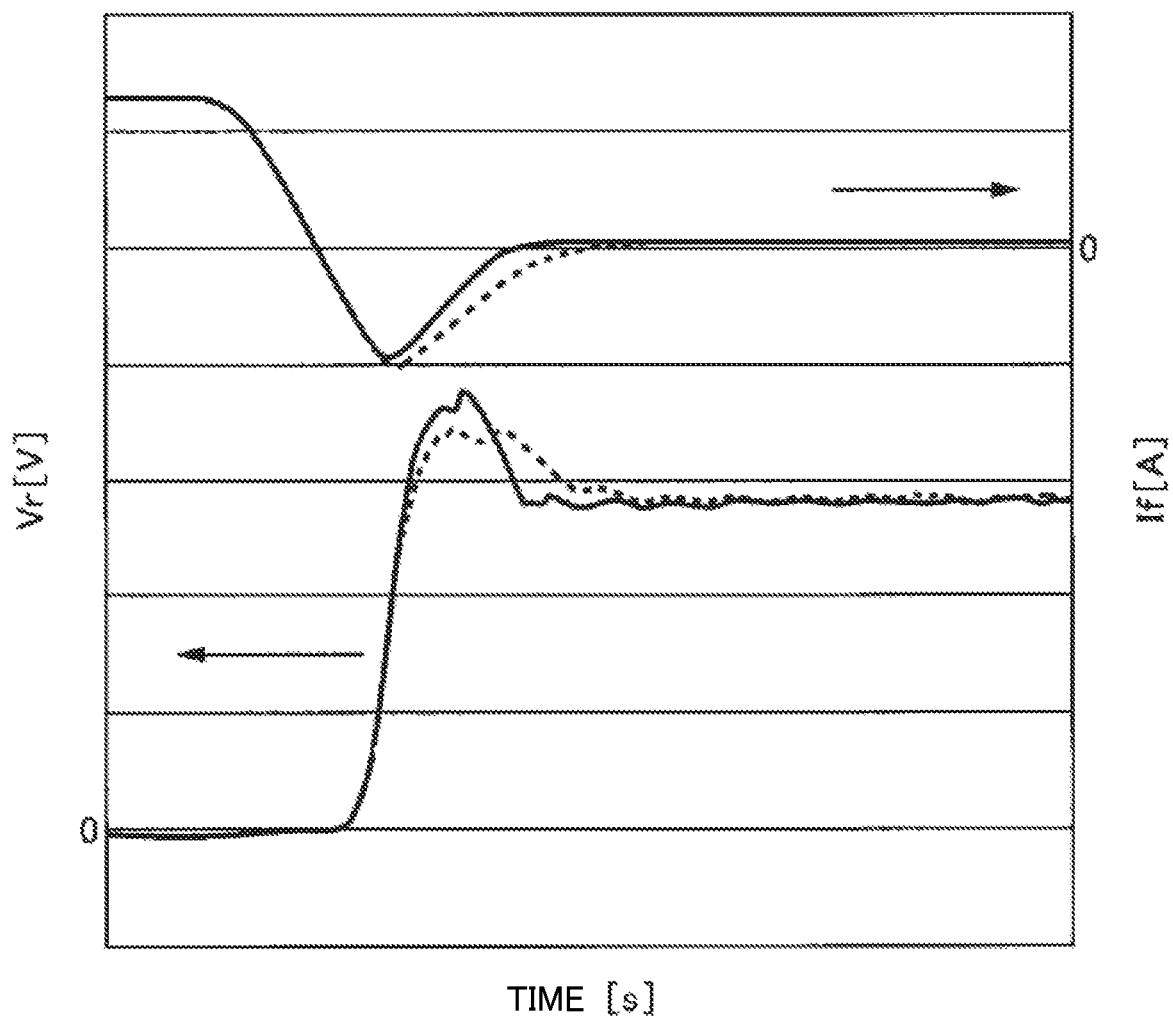
FIG. 6 is a figure showing time waveforms of a reverse voltage Vr and a reverse current Ir at the time of reverse recovery operation of the semiconductor device 100.

FIG. 6 is a figure showing time waveforms of the reverse voltage Vr and the reverse current Ir at the time of reverse recovery operation of the semiconductor device 100. In FIG. 6, an example in which the lifetime killer 28 is implanted is indicated with a solid line, and an example in which the lifetime killer 28 is not implanted is indicated with a dotted line.

It can be known that as shown in FIG. 6, tail current in the reverse current Ir decreases by implanting the lifetime killer 28. Thereby, loss at the time of reverse recovery operation can be reduced. Also, significant oscillation is not generated to voltage/current at the time of reverse recovery operation.

Figure 7:
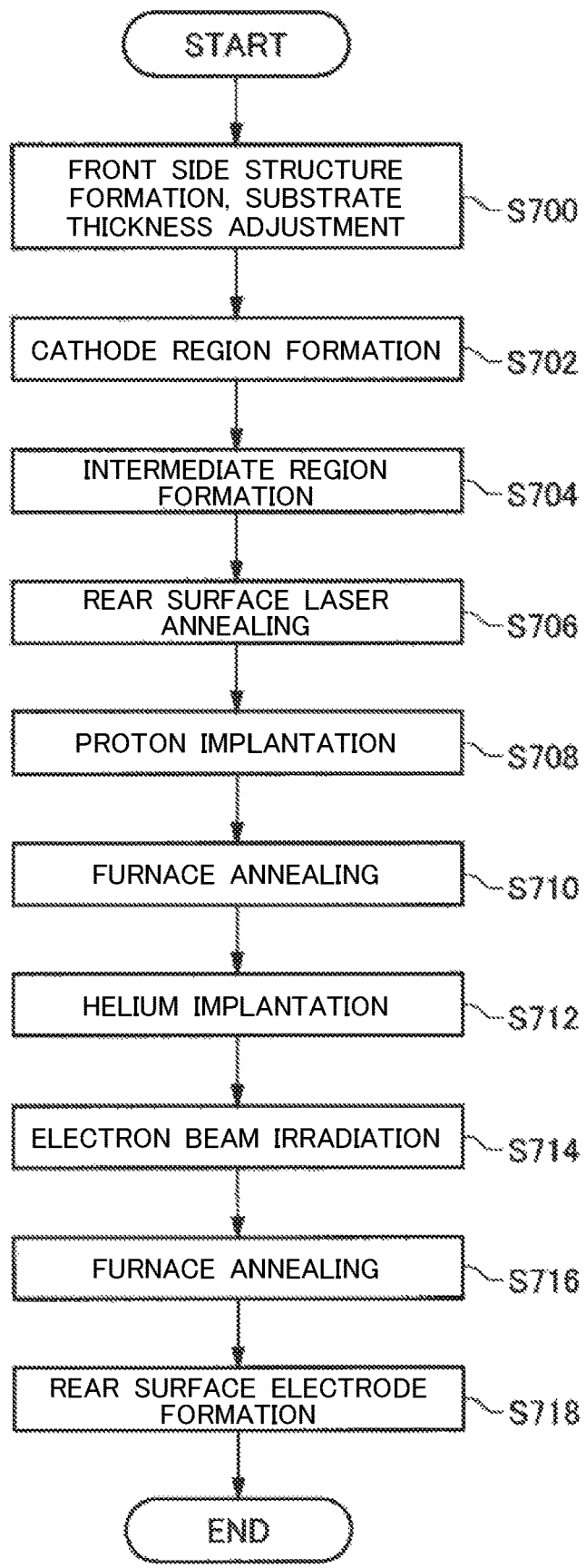
FIG. 7 is a figure showing one example of a process of manufacturing the semiconductor device 100.

FIG. 7 is a figure showing one example of a process of manufacturing the semiconductor device 100. First, at a front side structure formation step S700, a front surface side structure of the semiconductor device 100 is formed. In the example shown in FIG. 1, the anode electrode 12 and the anode region 16 are formed. Also, at S700, after forming the front surface side structure, the rear surface side of the semiconductor substrate 10 is polished to adjust the thickness of the semiconductor substrate 10 according to a predetermined withstand voltage.

Next, at a cathode region formation step S702, impurities are implanted from the rear surface side of the semiconductor substrate 10 to form the cathode region 24. As one example, at S702, the impurities are phosphorus, the dose amount is $1 \times 10^{15}/cm^2$, and the accelerating voltage is 40 keV.

Next, at an intermediate region formation step S704, impurities are locally implanted from the rear surface side of the semiconductor substrate 10 to form the intermediate region 22. As one example, at S704, the impurities are boron, the dose amount is $1 \times 10^{13}/cm^2$, and the accelerating voltage is 240 keV. The dose amount of boron may be equal to or greater than $3 \times 10^{12}/cm^2$ and equal to or less than $3 \times 10^{13}/cm^2$. Next, at a laser annealing step S706, a region to which the impurities are implanted from the rear surface side of the semiconductor substrate 10 is annealed.

Next, at a proton implantation step S708, protons are implanted from the rear surface side of the semiconductor substrate 10 to form the FS region 20. If four peaks 26 are formed in the FS region 20 as shown in FIG. 2, protons are implanted four times at different accelerating voltages.

As one example, the dose amount of protons and the accelerating voltage corresponding to the fourth peak 26-4 are $3.0 \times 10^{14}/cm^2$ and 400 keV, respectively, the dose amount of protons and accelerating voltage corresponding to the third peak 26-3 are $1.0 \times 10^{13}/cm^2$ and 820 keV, respectively, the dose amount of protons and accelerating voltage corresponding to the second peak 26-2 are $7.0 \times 10^{12}/cm^2$ and 1100 keV, respectively, and the dose amount of protons and accelerating voltage corresponding to the first peak 26-1 are $1.0 \times 10^{13}/cm^2$ and 1450 keV, respectively.

Next, at a first furnace annealing step S710, the semiconductor substrate 10 is annealed in an annealing furnace for example in a nitrogen atmosphere. As one example, the annealing temperature is 370 degrees and the annealing time is five hours. Next, at a helium implantation step S712, helium is implanted from the rear surface side of the semiconductor substrate 10 to form the lifetime killer 28. As one example, at S712, $He^{2+}$ is implanted in the dose amount of $2 \times 10^{12}/cm^2$ and at the acceleration energy of 700 keV.

Next, at an electron beam irradiation step S714, the rear surface side of the semiconductor substrate 10 is irradiated with electron beams. As one example, the electron beam irradiation amount is 160 kGy. Next, at a second furnace annealing step S716, the semiconductor substrate 10 is annealed in an annealing furnace for example in a nitrogen atmosphere. As one example, the annealing temperature is 360 degrees, and the annealing time is one hour.

Next, at a rear surface electrode formation step S718, the cathode electrode 14 is formed. The cathode electrode 14 may be formed by sputtering. Also, the cathode electrode 14 may be a stacked electrode formed by stacking aluminum layers, titanium layers, nickel layers and the like. The semiconductor device 100 can be manufactured in steps like the ones explained above.

Figure 8:
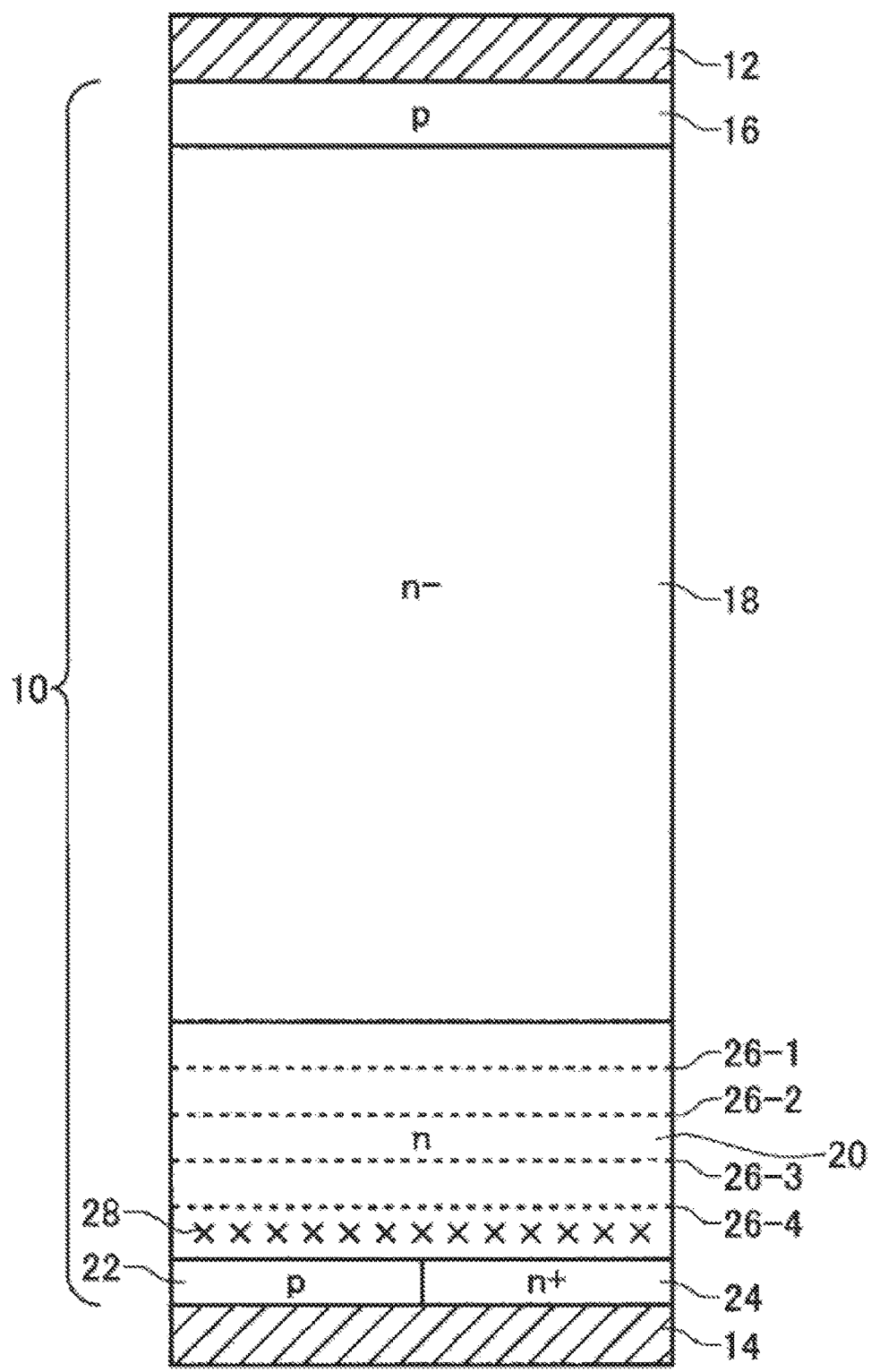
FIG. 8 is a cross-sectional view showing another structure example of the semiconductor device 100.

FIG. 8 is a cross-sectional view showing another structure example of the semiconductor device 100. The semiconductor device 100 in the present example is different from the semiconductor device 100 shown in FIG. 1 in terms of the position of the intermediate region 22. In other respects, the structure may be the same as that of the semiconductor device 100 shown in FIG. 1.

The intermediate region 22 in the present example is formed at the same depth position as the cathode region 24. In this case, in addition to being formed between any of the peaks 26 of the FS region 20 and the concentration peak of the intermediate region 22, the lifetime killer 28 is also formed between any of the peaks 26 of the FS region 20 and the concentration peak of the cathode region 24.

The positions, in the depth direction, of the lifetime killer 28 formed above the intermediate region 22 and the lifetime killer 28 formed above the cathode region 24 may be the same with each other. Even with such a configuration also, tail current at the time of reverse recovery operation can be reduced, and increase in leak current can be suppressed.

Figure 9:
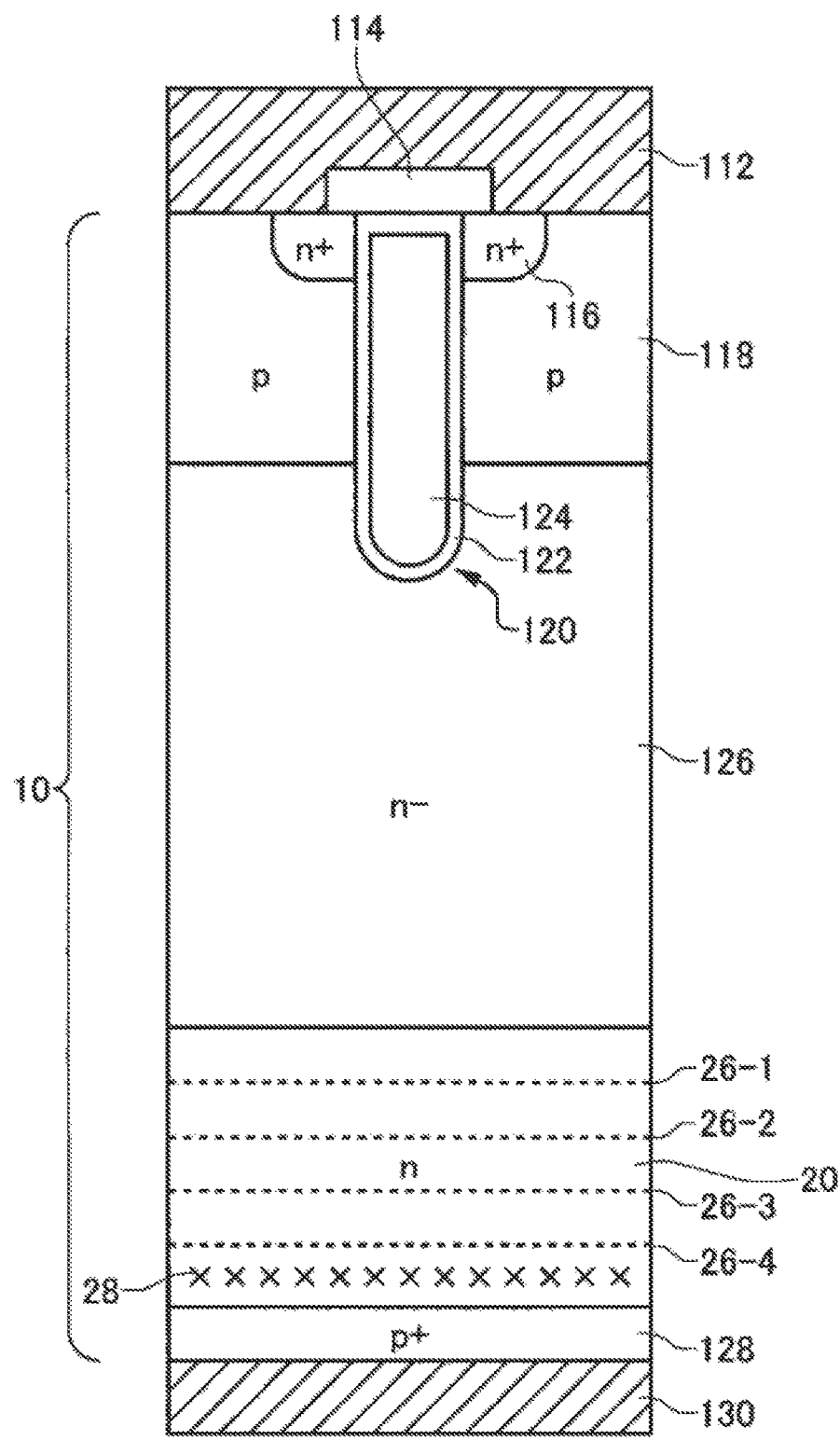
FIG. 9 is a figure showing a cross-section of a semiconductor device 200 according to another embodiment.

FIG. 9 is a figure showing a cross-section of a semiconductor device 200 according to another embodiment. The semiconductor device 200 is an IGBT (Insulated Gate Bipolar Transistor). The semiconductor device 200 includes the semiconductor substrate 10, an emitter electrode 112 and a collector electrode 130.

The emitter electrode 112 is provided contacting the front surface of the semiconductor substrate 10. The collector electrode 130 is provided contacting the rear surface of the semiconductor substrate 10. The emitter electrode 112 and the collector electrode 130 are formed of metal materials containing aluminum, for example.

A gate structure 120 is formed on the front surface side of the semiconductor substrate 10. The gate structure 120 in the present example is of a trench type, but the gate structure 120 may be of a planar type. The gate structure 120 has a gate-insulating film 122 and a gate electrode 124.

The gate-insulating film 122 is formed covering the periphery of the gate electrode 124. The gate-insulating film 122 of the present example is formed covering the inner wall of a gate trench formed on the front surface of the semiconductor substrate 10. The gate electrode 124 is formed at a position facing a base region 118 where a channel is formed. The gate electrode 124 of the present example is polysilicon formed being covered by the gate-insulating film 122 inside the gate trench. The gate electrode 124 of the present example faces the base region 118 along the depth direction of the semiconductor substrate 10.

An interlayer dielectric film 114 covering the gate structure 120 is formed on the front surface of the semiconductor substrate 10. Thereby, the emitter electrode 112 and the gate structure 120 are insulated.

An n+-type emitter region 116 and a p-type base region 118 are formed on the front surface side of the semiconductor substrate 10. The base region 118 is one example of a first region. The gate structure 120 of the present example is formed penetrating the base region 118. The emitter region 116 is formed in a region adjoining the gate structure 120. On the front surface of the semiconductor substrate 10, the emitter region 116 and the base region 118 contact the emitter electrode 112.

An n−-type drift region 126 is formed on the rear surface side of the base region 118. The FS region 20 is formed on the rear surface side of the drift region 126. A p+-type collector region 128 is formed on the rear surface side of the FS region 20. The collector region 128 is one example of a second region.

In the present example also, the concentration peak of the lifetime killer 28 is arranged between the first peak 26-1 that is closest to the front surface of the semiconductor substrate 10 among the peaks 26 of the impurity concentration in the FS region 20 and the rear surface of the semiconductor substrate 10. The concentration peak of the lifetime killer 28 is preferably arranged between the fourth peak 26-4 that is closest to the rear surface of the semiconductor substrate 10 among the peaks 26 of the impurity concentration in the FS region 20 and the concentration peak of the collector region 128.

Figure 10:
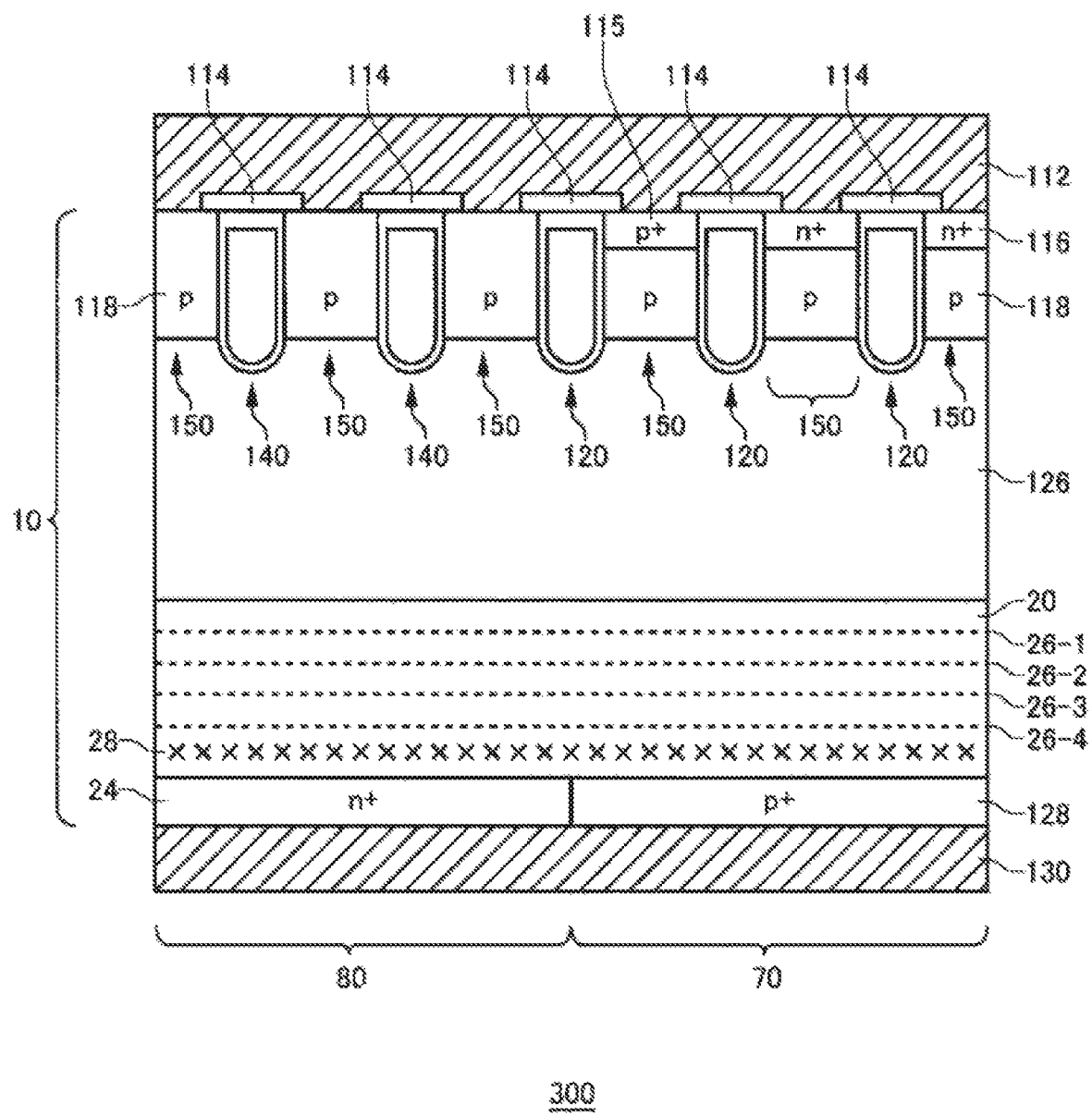
FIG. 10 is a figure showing a cross-section of a semiconductor device 300 according to another embodiment.

FIG. 10 is a figure showing a cross-section of a semiconductor device 300 according to another embodiment. The semiconductor device 300 is a reverse conducting IGBT (RC-IGBT) in which an IGBT and a diode for reverse recovery are formed on the same substrate. The semiconductor device 300 includes the semiconductor substrate 10, the emitter electrode 112 and the collector electrode 130.

On the rear surface side of the semiconductor substrate 10 of the present example, the p+-type collector region 128 is formed in the transistor portion 70 which is a region to function as an IGBT, and the n+-type cathode region 24 is formed in the diode portion 80 which is a region to function as a diode. An emitter region 116 may not be present, but a p+-type contact region 115 may be formed on the front surface of the base region 118 in a mesa portion 150 which among mesa portions 150 of the transistor portion 70 (regions of the semiconductor substrate sandwiched by trench portions) and adjoins a trench portion 120 that is at or closest to a position that imaginarily appears on the front surface if the position at which the cathode region 24 contacts the collector region 128 is imaginarily projected onto the front surface.

The structure of the transistor portion 70 is similar to that of the semiconductor device 200 shown in FIG. 9. However in the present example, a plurality of gate structures 120 are formed in the transistor portion 70. The gate electrode(s) 124 of at least one among the plurality of gate structures 120 is/are electrically connected to the gate terminal. Also, the gate electrode(s) 124 of at least one of the plurality of gate structures 120 may be electrically connected to the emitter electrode 112, and function as a dummy trench. By providing a dummy trench, an injection-enhancement effect (IE effect) can be attained.

The structure of a region to function as a diode is similar to that of the semiconductor device 100 shown in FIG. 1 or FIG. 8. The base region 118 shown in FIG. 10 functions as an anode region of the diode.

Also, the intermediate region 22 is omitted in FIG. 10. The intermediate region 22 may be locally formed above the cathode region 24 shown in FIG. 10 similar to the semiconductor device 100 shown in FIG. 1. Also, in the semiconductor substrate 10 shown in FIG. 10, the front surface side of the diode portion 80 has one or more dummy trench structures 140. The dummy trench structures 140 have structures similar to those of the gate structures 120. However, the gate electrode in a dummy trench structure 140 is electrically connected to the emitter electrode 112.

The concentration peak of the lifetime killer 28 in a region to function as the diode is provided at a position similar to that in the semiconductor device 100 shown in FIG. 1 or FIG. 8. Also, the concentration peak of the lifetime killer 28 in the transistor portion 70 is provided at a position similar to that in the semiconductor device 200 shown in FIG. 9. The lifetime killer 28 may be formed at the same depth positions in the transistor portion 70 and the diode portion 80.

Figure 11:
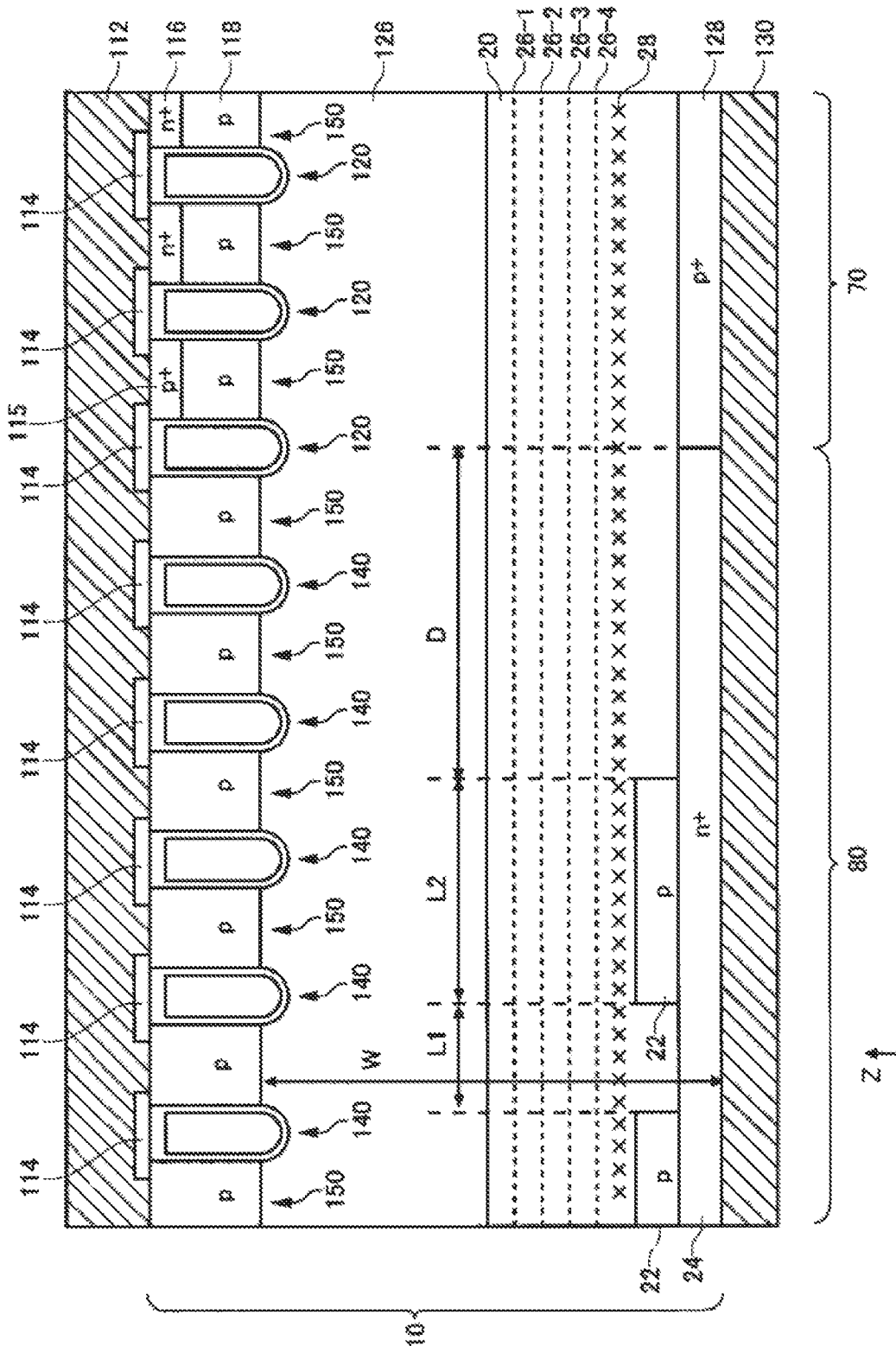
FIG. 11 is a figure showing another example of a cross-section of the semiconductor device 300.

FIG. 11 is a figure showing another example of a cross-section of the semiconductor device 300. The semiconductor device 300 of the present example has the intermediate regions 22. In respects other than the intermediate regions 22, the structure may be the same as that of the semiconductor device 300 shown in FIG. 10.

In the present example, a region in the semiconductor substrate 10 to function as a transistor such as an IGBT is assumed to be the transistor portion 70, and a region of it to function as a diode such as a FWD is assumed to be the diode portion 80. The emitter region 116 is formed on the front surface of the transistor portion 70, and the collector region 128 is formed on the rear surface of it. The emitter region 116 is not formed on the front surface of the diode portion 80, but the base region 118 is formed therein, and the cathode region 24 is formed on the rear surface of it. The boundary between the collector region 128 and the cathode region 24 is assumed to be the boundary between the transistor portion 70 and the diode portion 80.

The emitter region 116 may not be present, but the P+-type contact region 115 may be formed on the front surface of the base region 118 in a mesa portion 150 which is among mesa portions 150 of the transistor portion 70 (regions of the semiconductor substrate sandwiched by trench portions) and adjoins a trench portion 120 that is at or closest to a position that imaginarily appears on the front surface if a position at which the cathode region 24 contacts the collector region 128 is imaginarily projected onto the front surface.

The intermediate regions 22 are provided to the diode portion 80. The intermediate regions 22 may be formed on the cathode region 24 as shown in FIG. 1, or may be formed at the same depth position as the cathode region 24 as shown in FIG. 8.

The gate structures 120 having trench structures and the dummy trench structures 140 are formed extending in the direction perpendicular to the cross-section shown in FIG. 11. The direction in which the gate structures 120 and the dummy trench structures 140 extend is assumed to be the trench longitudinal direction (Y-axis direction in FIG. 11), and the direction that is orthogonal to the trench longitudinal direction on the front surface of the semiconductor substrate 10 is assumed to be the trench traverse direction (X-axis direction in FIG. 11).

The distance that is between the boundary between the transistor portion 70 and the diode portion 80 and the intermediate region 22 closest to the transistor portion 70, and is along in the trench traverse direction (X-axis direction) on a plane parallel with the rear surface of the semiconductor substrate 10 is assumed to be D. That is, the distance in the X-axis direction between the collector region 128 and the intermediate region 22 is assumed to be D.

Also, a plurality of the intermediate regions 22 are formed discretely on a plane parallel with the rear surface of the semiconductor substrate 10. The interval between the intermediate regions 22 in the trench traverse direction (X-axis direction) is assumed to be L1, and the width of the intermediate regions 22 is assumed to be L2. The interval L1 and width L2 of the intermediate regions 22 used may be the average values or the maximum values of the plurality of intermediate regions 22. Also, the thickness of the semiconductor substrate 10 in the depth direction (Z-axis direction in FIG. 11) orthogonal to both the trench longitudinal direction and the trench traverse direction is assumed to be W.

The distance D between the collector region 128 and the intermediate region 22 is greater than the interval L1 between the intermediate regions 22. That is, in an end portion region of the diode portion 80 adjoining the transistor portion 70, the density of the intermediate regions 22 is low as compared with other regions. The end portion region of the diode portion 80, as one example, may refer to one or more trench portions sandwiching one or more mesa portions 150 in the trench traverse direction, starting from a position that imaginarily appears on the front surface if the position at which the cathode region 24 contacts the collector region 128 is imaginarily projected onto the front surface. Near the boundary between the transistor portion 70 and the diode portion 80, the collector region 128 can function similar to the intermediate regions 22 at the time of reverse recovery. Because of this, in the end portion region of the diode portion 80, oscillation of voltage and current at the time of reverse recovery can be suppressed even without providing the intermediate regions 22. The boundary between the transistor portion 70 and the diode portion 80, as one example, may refer to a position at which the cathode region 24 contacts the collector region 128.

Because intermediate regions 22 are not provided in the end portion region of the diode portion 80, the total area of intermediate regions 22 on the XY plane can be reduced. Because of this, operation of the diode portion 80 can be stabilized, and forward voltage of the diode portion 80 can be reduced.

Also, the distance D between the collector region 128 and the intermediate region 22 may be greater than the width L2 of the intermediate regions 22. Also, the distance D between the collector region 128 and the intermediate region 22 may be greater than the thickness W of the semiconductor substrate 10. Even if the intermediate regions 22 are arranged in this manner, because the collector region 128 of the transistor portion 70 is provided, oscillation of voltage and current at the time of reverse recovery can be suppressed. If the distance D is increased more, characteristics such as forward voltage of the diode portion 80 can be improved more.

Figure 12:
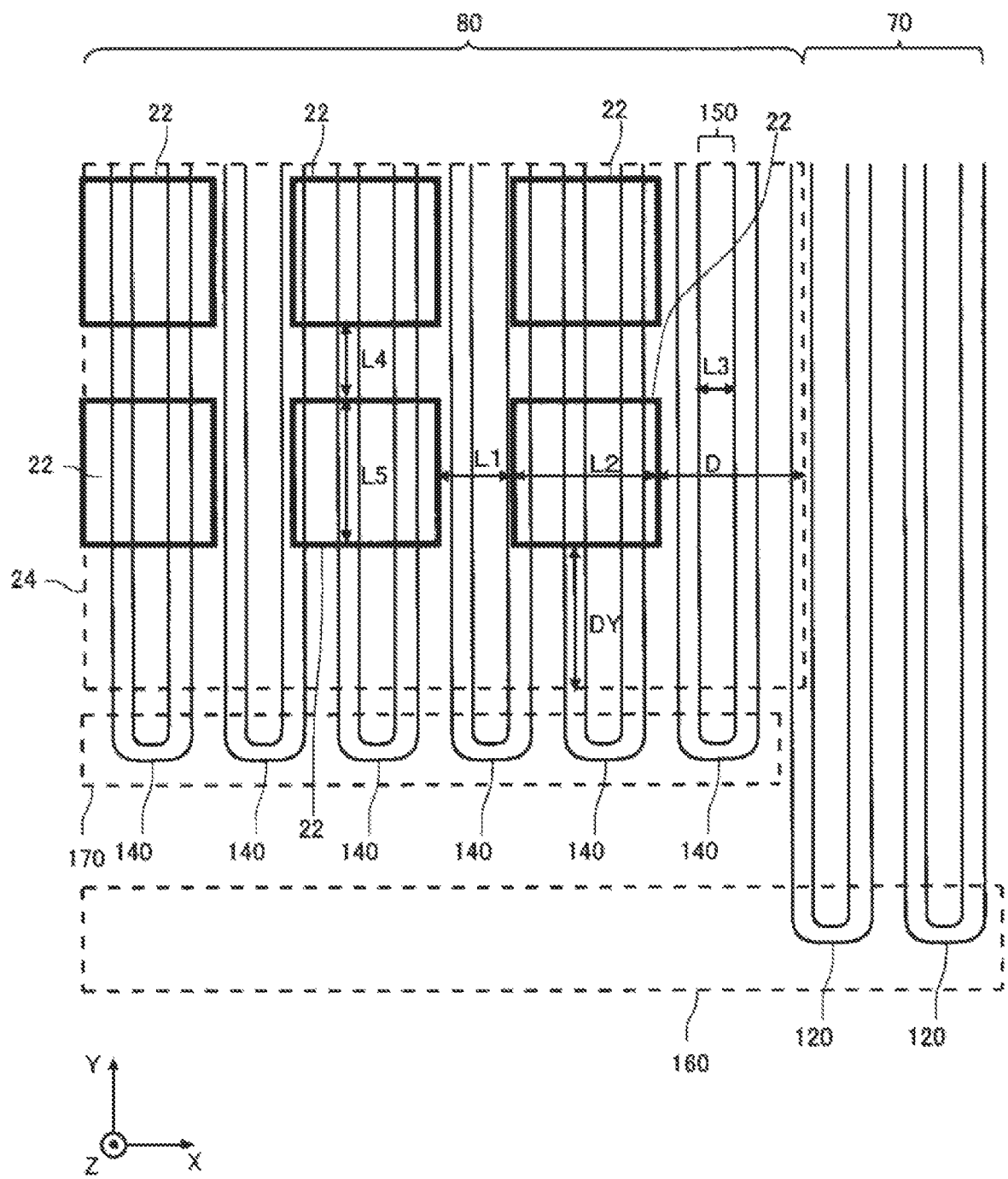
FIG. 12 is a figure showing an arrangement example of the intermediate regions 22 on a plane parallel with the rear surface of the semiconductor device 300 shown in FIG. 11.

FIG. 12 is a figure showing an arrangement example of the intermediate regions 22 on a plane parallel with the rear surface of the semiconductor device 300 shown in FIG. 11. In FIG. 12, the positions of the intermediate regions 22, the gate structures 120, the, dummy trench structures 140 the cathode region 24, the gate-connecting portion 160 and the dummy-connecting portion 170 are shown as being overlapping one on another. On the rear surface side of the semiconductor substrate 10, a region where the cathode region 24 is not formed has the collector region 128 formed therein.

Although the gate structures 120 and the dummy trench structures 140 of the present example have U-shapes, the shapes of the gate structures 120 and the dummy trench structures 140 are not limited thereto. The gate structures 120 and the dummy trench structures 140 respectively have linear portions that are formed extending in the Y-axis direction. A region sandwiched by the linear portions of the gate structures 120 or the dummy trench structures 140 is referred to as a mesa portion 150.

The gate-connecting portion 160 is a gate runner connected to a gate electrode 124 of a gate structure 120. The dummy-connecting portion 170 is a dummy runner connected to an electrode inside a dummy trench structure 140. The gate-connecting portion 160 and the dummy-connecting portion 170 of the present example are formed of polysilicon or the like. The gate-connecting portion 160 and the dummy-connecting portion 170 are formed above the front surface of the semiconductor substrate 10. An insulating film such as the interlayer dielectric film 114 is formed between the gate-connecting portion 160 and the dummy-connecting portion 170, and the semiconductor substrate 10. The gate-connecting portion 160 and the dummy-connecting portion 170 pass contact holes formed in the interlayer dielectric film 114 and contact the front surface of the semiconductor substrate 10. The gate-connecting portion 160 may be connected to a gate pad formed of a metal material. The dummy-connecting portion 170 may be connected to the emitter electrode 112.

As mentioned above, the gate structures 120 are formed on the front surface side of the transistor portion 70, and the collector region 128 is formed on the rear surface side. In the transistor portion 70, one or more linear portions of the dummy trench structures 140 and one or more linear portions of the gate structures 120 may be formed alternately in the X-axis direction.

The dummy trench structures 140 are formed on the front surface side of the diode portion 80, and the cathode region 24 and the intermediate regions 22 are formed on the rear surface side. The distance D between an end portion of the cathode region 24 in the X-axis direction and the intermediate region 22 may be greater than the width L3 of the mesa portion 150. That is, in an end portion region of the diode portion 80 in the X-axis direction, intermediate regions 22 may not be formed below at least one mesa portion 150. In an end portion region of the diode portion 80 in the X-axis direction, intermediate regions 22 may not be formed below a plurality of mesa portions 150.

Also, in the Y-axis direction, the distance between an end portion of the cathode region 24 (portion contacting the collector region 128) and the intermediate region 22 is assumed to be DY. The distance DY may be greater than the interval L4 between intermediate regions 22 in the Y-axis direction, greater than the width L5 between intermediate regions 22 in the Y-axis direction, or greater than the thickness W of the semiconductor substrate 10. The distance DY may be the same as the distance D.

Figure 13:
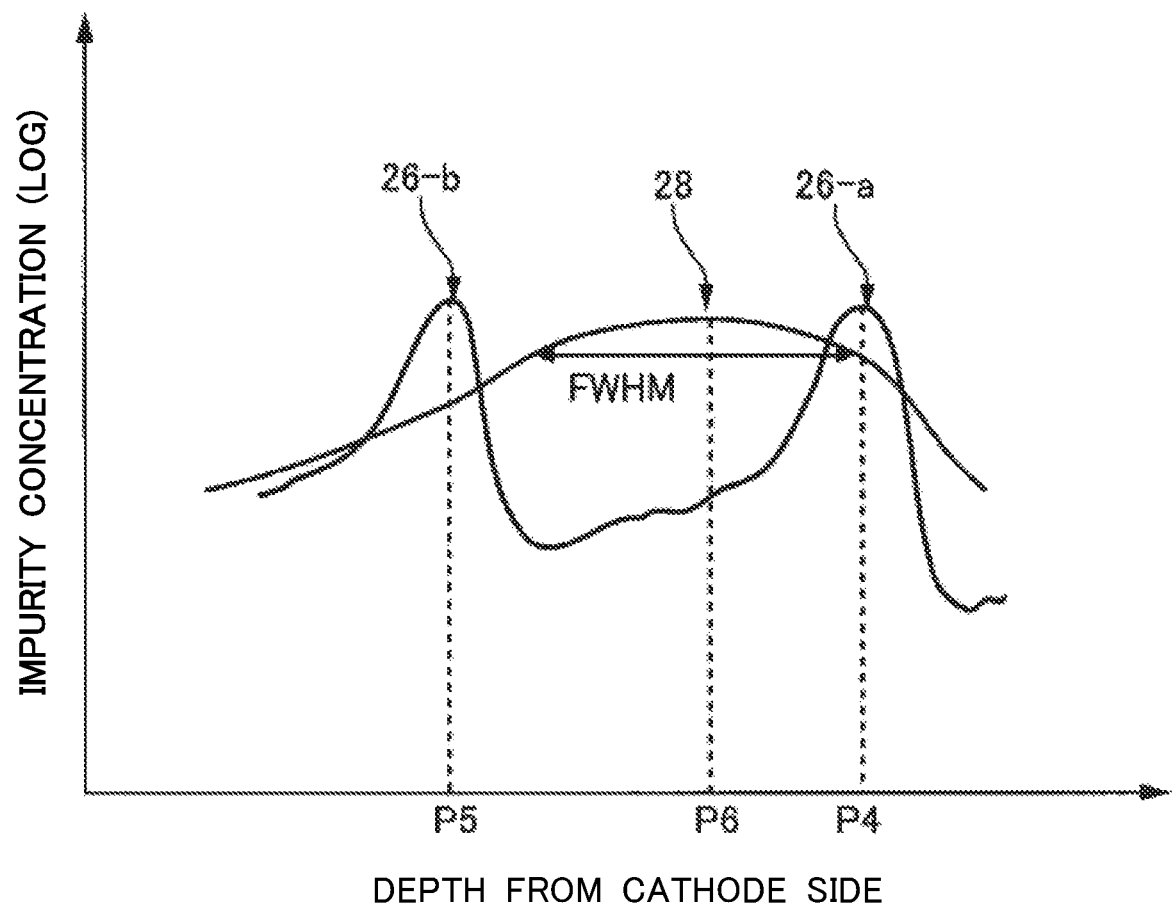
FIG. 13 is a figure showing another example of the concentration distribution of the lifetime killer 28 in the depth direction.

FIG. 13 is a figure showing another example of the concentration distribution of the lifetime killer 28 in the depth direction. In the present example, a position P6 of the peak of the lifetime killer 28 is arranged between positions P4 and P5 of the two peaks 26-a, 26-b in the FS region 20. The position P6 may be arranged in the middle between the positions P4 and P5. As mentioned above, by arranging the peak position of the lifetime killer 28 and the peak position in the FS region 20 apart from each other, cancellation between the lifetime killer 28 and protons or the like in the FS region 20 is suppressed.

The concentration distribution of the lifetime killer 28 of the present example has a relatively broad distribution. Because the lifetime killer 28 has a broad concentration distribution, the semiconductor device 100 can be caused to perform soft-recovery operation. Also, even if the implantation position of the lifetime killer 28 varies, the influence of the variation can be reduced. As one example, the full width at half maximum FWHM of the concentration distribution of the lifetime killer 28 is equal to or greater than 5 μm. The full width at half maximum FWHM may be equal to or greater than 7 μm, or equal to or greater than 9 μm.

Also, the full width at half maximum FWHM of the concentration distribution of the lifetime killer 28 may be equal to or greater than 70% of the interval (P4-P5) of the two peaks 26-a and 26-b sandwiching the peak of the concentration of the lifetime killer 28. The full width at half maximum FWHM may be equal to or greater than 80% or 100% of the interval (P4-P5) of the peak 26 of the FS region 20.

Also, the lifetime killer 28 may be distributed to reach a position where it overlaps the two peaks 26-a and 26-b of the FS region 20. As one example, at both the position P4 and the position P5, the concentration of the lifetime killer 28 may be equal to or greater than 1% or 10% of the peak concentration of the lifetime killer 28.

While the embodiments of the present invention have been described, the technical scope of the invention is not limited to the above described embodiments. It is apparent to persons skilled in the art that various alterations and improvements can be added to the above-described embodiments. It is also apparent from the scope of the claims that the embodiments added with such alterations or improvements can be included in the technical scope of the invention.

The operations, procedures, steps, and stages of each process performed by an apparatus, system, program, and method shown in the claims, embodiments, or diagrams can be performed in any order as long as the order is not indicated by "prior to," "before," or the like and as long as the output from a previous process is not used in a later process. Even if the process flow is described using phrases such as "first" or "next" in the claims, embodiments, or diagrams, it does not necessarily mean that the process must be performed in this order.

EXPLANATION OF REFERENCE SYMBOLS

10: semiconductor substrate; 12: anode electrode; 14: cathode electrode; 16: anode region; 18: drift region; 20: FS region; 22: intermediate region; 23: peak; 24: cathode region; 26: peak; 28: lifetime killer; 70: transistor portion; 80: diode portion; 100: semiconductor device; 112: emitter electrode; 114: interlayer dielectric film; 115: contact region; 116: emitter region; 118: base region; 120: gate structure; 122: gate-insulating film; 124: gate electrode; 126: drift region; 128: collector region; 130: collector electrode; 140: dummy trench structure; 150: mesa portion; 160: gate-connecting portion; 170: dummy-connecting portion; 200: semiconductor device; 300: semiconductor device

What is claimed is:
1. A semiconductor device comprising:
a semiconductor substrate;
a first region of a first conductivity type formed on a front surface side of the semiconductor substrate;
a drift region of a second conductivity type formed closer to a rear surface of the semiconductor substrate than the first region is;
a buffer region of a second conductivity type that: is formed closer to the rear surface of the semiconductor substrate than the drift region is; and has a plurality of peaks of an impurity concentration distribution that are higher than an impurity concentration of the drift region;
a lifetime killer that: is arranged on a rear surface side of the semiconductor substrate; and shortens a carrier lifetime;
a second region of a first conductivity type formed between: a peak that is closest to the rear surface of the semiconductor substrate among the peaks of the impurity concentration in the buffer region; and the rear surface of the semiconductor substrate; and
a cathode region of a second conductivity type formed at a same depth position as the second region, wherein
a peak of a concentration distribution of the lifetime killer is arranged between a peak that is closest to a front surface of the semiconductor substrate among the plu- rality of peaks of the impurity concentration distribution in the buffer region, and a rear surface side of the buffer region, the peak of the concentration distribution of the lifetime killer is within the buffer region, the peak of the concentration distribution of the lifetime killer is arranged at a position that does not overlap any one or more of the plurality of peaks of the impurity concentration distribution in the buffer region, the peak of the concentration distribution of the lifetime killer is arranged at a position that does not overlap a peak of an impurity concentration distribution in the second region, the peak of the concentration distribution of the lifetime killer is arranged closer to the front surface of the semiconductor substrate than the peak of the impurity concentration distribution in the second region is, and the lifetime killer is also formed above the cathode region.

2. A semiconductor device comprising:
a semiconductor substrate;
a first region of a first conductivity type formed on a front surface side of the semiconductor substrate;
a drift region of a second conductivity type formed closer to a rear surface of the semiconductor substrate than the first region is;
a buffer region of a second conductivity type that: is formed closer to the rear surface of the semiconductor substrate than the drift region is; and has a plurality of peaks of an impurity concentration distribution that are higher than an impurity concentration of the drift region;
a lifetime killer that: is arranged on a rear surface side of the semiconductor substrate; and shortens a carrier lifetime; and
a second region of a first conductivity type formed between: a peak that is closest to the rear surface of the semiconductor substrate among the plurality of peaks of the impurity concentration distribution in the buffer region; and the rear surface of the semiconductor substrate, wherein
a peak of a concentration distribution of the lifetime killer is arranged between a peak that is closest to a front surface of the semiconductor substrate among the plurality of peaks of the impurity concentration distribution in the buffer region, and a rear surface side of the buffer region, the peak of the concentration distribution of the lifetime killer is within the buffer region, the peak of the concentration distribution of the lifetime killer is arranged at a position that does not overlap any one or more of the plurality of peaks of the impurity concentration distribution in the buffer region, the peak of the concentration distribution of the lifetime killer is arranged at a position that does not overlap a peak of an impurity concentration distribution in the second region, the semiconductor substrate has a transistor portion in which a transistor is formed and a diode portion in which a diode is formed, the second regions are discretely provided in the diode portion, and on a plane parallel with the rear surface of the semiconductor substrate, a distance D between a boundary between the transistor portion and the diode portion and the second region is greater than an interval between the second regions.

3. A semiconductor device comprising:
a semiconductor substrate;
a first region of a first conductivity type formed on a front surface side of the semiconductor substrate;
a drift region of a second conductivity type formed closer to a rear surface of the semiconductor substrate than the first region is;
a buffer region of a second conductivity type that: is formed closer to the rear surface of the semiconductor substrate than the drift region is; and has one or more peaks of an impurity concentration that are higher than an impurity concentration of the drift region; and
a second region of a first conductivity type formed between: a peak that is closest to the rear surface of the semiconductor substrate among the peaks of the impurity concentration in the buffer region; and the rear surface of the semiconductor substrate, wherein
the semiconductor substrate has a transistor portion in which a transistor is formed and a diode portion in which a diode is formed,
the second regions are discretely provided in the diode portion, and
on a plane parallel with the rear surface of the semiconductor substrate, a distance D between a boundary between the transistor portion and the diode portion and the second region is greater than an interval between the second regions.

4. The semiconductor device according to claim 3, wherein the distance D is greater than a thickness of the semiconductor substrate.

5. The semiconductor device according to claim 3, wherein the distance D is greater than a width of the second region.

6. The semiconductor device according to claim 3, wherein
the diode portion includes:
a plurality of dummy trench structures; and
a mesa portion which is a region of the semiconductor substrate sandwiched by the dummy trench structures, and
the distance D is greater than a width of the mesa portion in a direction which is the same as a direction of the distance D.

7. The semiconductor device according to claim 3, wherein
the diode portion includes:
a dummy trench structure including a linear portion extending in an extending direction on a plane parallel with the rear surface of the semiconductor substrate; and
a cathode region of a second conductivity type formed on a rear surface side of the second region, and
a distance DY between the cathode region and the second region in the extending direction is greater than at least either an interval between the second regions in the extending direction or a width of the second regions.

8. The semiconductor device according to claim 3, wherein
the diode portion includes:
a dummy trench structure including a linear portion extending in an extending direction on a plane parallel with the rear surface of the semiconductor substrate; and
a cathode region of a second conductivity type formed on a rear surface side of the second region, and a distance DY between the cathode region and the second region in the extending direction is the same as the distance D.

\* \* \* \* \*